(12) United States Patent
Ma et al.

(10) Patent No.: US 7,667,970 B2
(45) Date of Patent: Feb. 23, 2010

(54) HEAT SINK ASSEMBLY FOR MULTIPLE ELECTRONIC COMPONENTS

(75) Inventors: Wu-Jiang Ma, Shenzhen (CN); Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

(*) Notice: Subject to any disclaimer, the term of this patent is extended or adjusted under 35 U.S.C. 154(b) by 234 days.

(21) Appl. No.: 11/964,888

(22) Filed: Dec. 27, 2007

(65) Prior Publication Data

US 2009/0168355 A1   Jul. 2, 2009

(51) Int. Cl.
*H05K 7/20* (2006.01)
(52) U.S. Cl. ...................................... 361/704
(58) Field of Classification Search ................. 361/707, 361/719, 736, 807, 720
See application file for complete search history.

(56) References Cited

U.S. PATENT DOCUMENTS 6,343,643 B1* 2/2002 Bollesen .................... 165/80.3
6,490,161 B1* 12/2002 Johnson ....................... 361/704
6,680,848 B2* 1/2004 Petit et al. .................... 361/704
7,428,154 B2* 9/2008 Ishimine et al. ............. 361/704

* cited by examiner

*Primary Examiner*—Jayprakash N Gandhi
*Assistant Examiner*—Courtney Smith

(57) ABSTRACT

A heat sink assembly for removing heat from two heat generating-components mounted on a printed circuit board, includes a first heat sink, a second heat sink, a plurality of poles each having a head at a top end and a double-layer spring. The first heat sink includes a base and a plurality of fins arranged on the base. The second heat sink has a first shoulder extending from a lateral side thereof. The first shoulder is disposed on the base. The double-layer spring includes an outer spring and an inner spring having a top end connected to a top end of the outer spring. One of the poles wearing the double-layer spring extends through the first shoulder and the base. The outer spring is compressed between the head of the pole and the first shoulder. The inner spring is compressed between the head of the pole and the base.

17 Claims, 4 Drawing Sheets

HEAT SINK ASSEMBLY FOR MULTIPLE ELECTRONIC COMPONENTS

BACKGROUND OF THE INVENTION

1. Field of the Invention

The present invention relates generally to a heat sink assembly, and more particularly to a heat sink assembly adapted for removing heat from multiple electronic heat-generating components of differing heights.

2. Description of Related Art

Electronic component includes numerous circuits operating at high speed and generating substantial heat. In many applications, it is desirable to employ a heat sink to remove heat from electronic heat-generating components, such as central processing units (CPUs) etc., to assure that the components function properly and reliably. A typical heat sink comprises a base for contacting with the heat-generating component to absorb the heat originated from the heat-generating component and a plurality of parallel planar fins attached to the base by soldering or adhering. Alternatively, the fins can be integrally formed with the base by metal extrusion, such as aluminum extrusion. The fins are used for dissipating the heat to ambient air.

With the development of various types of electronic modules, an array of many discrete components may be mounted to a surface of a single printed circuit board. In some circumstances, more than one of the components must be cooled. Since the components are generally of different heights and their top surfaces are thus at different levels, conventional heat sinks cannot meet the requirement to intimately contact with the top surfaces of the components simultaneously to remove the heat from all the components. Thus, more than one of individual heat sinks is need to be employed to remove heat from each component. Accordingly, a large amount of space and through holes drilled in the printed circuit board is required to install the heat sinks, thus restricting space for other components; furthermore, it is both expensive and time-consuming to attach individual heat sinks to each component.

What is needed is a heat sink assembly with a simple structure able to cool multiple components with different heights.

SUMMARY OF THE INVENTION

A heat sink assembly for removing heat from two heat generating-components mounted on a printed circuit board, includes a first heat sink, a second heat sink, a plurality of poles mounting the heat sinks onto the heat generating-components and a double-layer spring. The first heat sink comprises a base and a plurality of fins arranged on the base. The second heat sink has a first shoulder extending toward the first heat sink from a lateral side thereof. Each of the poles has a head at a top end thereof. The double-layer spring comprises an outer spring and an inner spring having a top end connected to a top end of the outer spring. The first shoulder is disposed on the base of the first heat sink. One of the poles wearing the double-layer spring extends through the first shoulder and the base. The outer spring is compressed between the head of the pole and the first shoulder. The inner spring is compressed between the head of the pole and the base of the first heat sink under the first shoulder.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
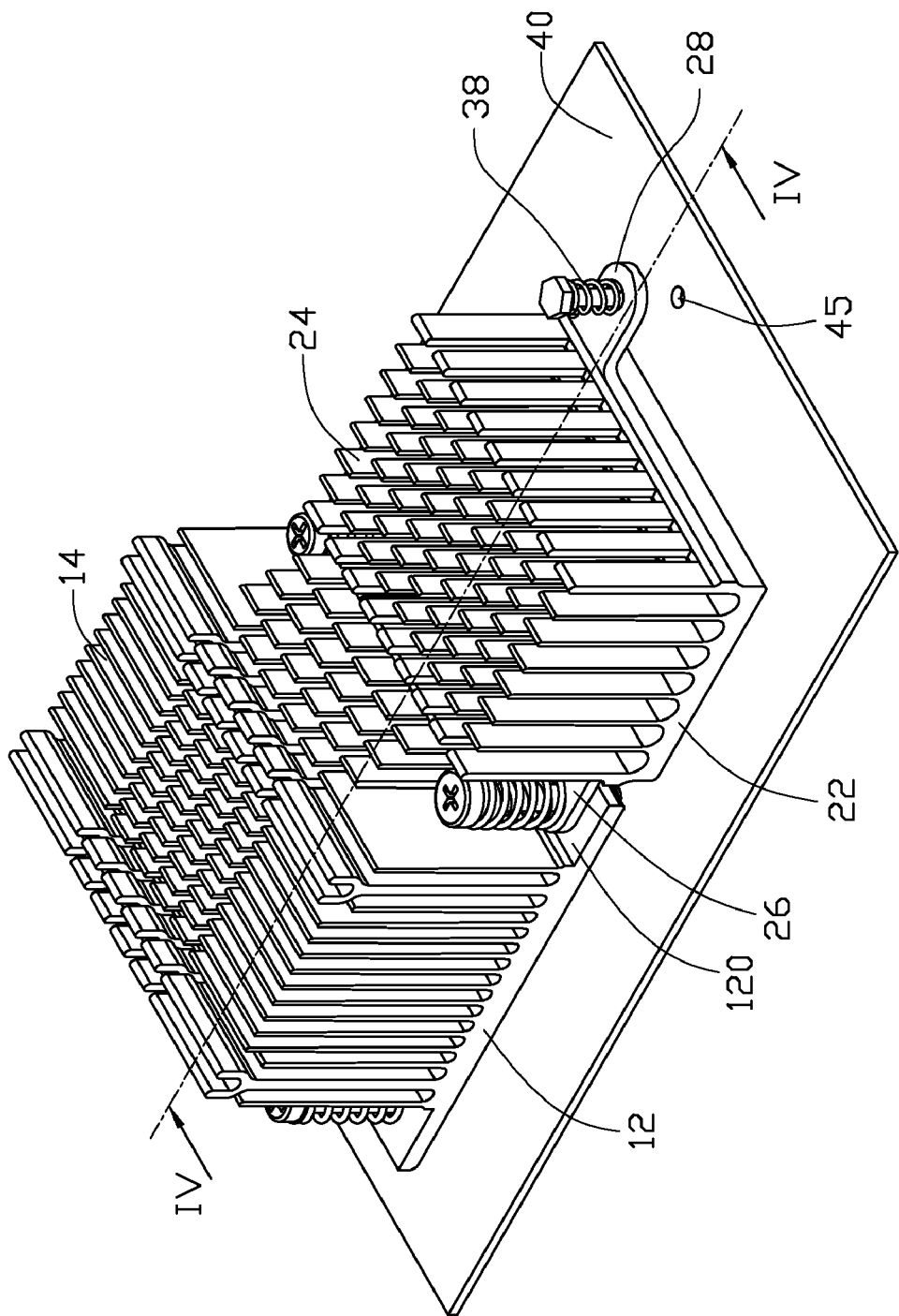
FIG. 1 is an assembled isometric view of a heat sink assembly in accordance with a preferred embodiment of the present invention.
Figure 2:
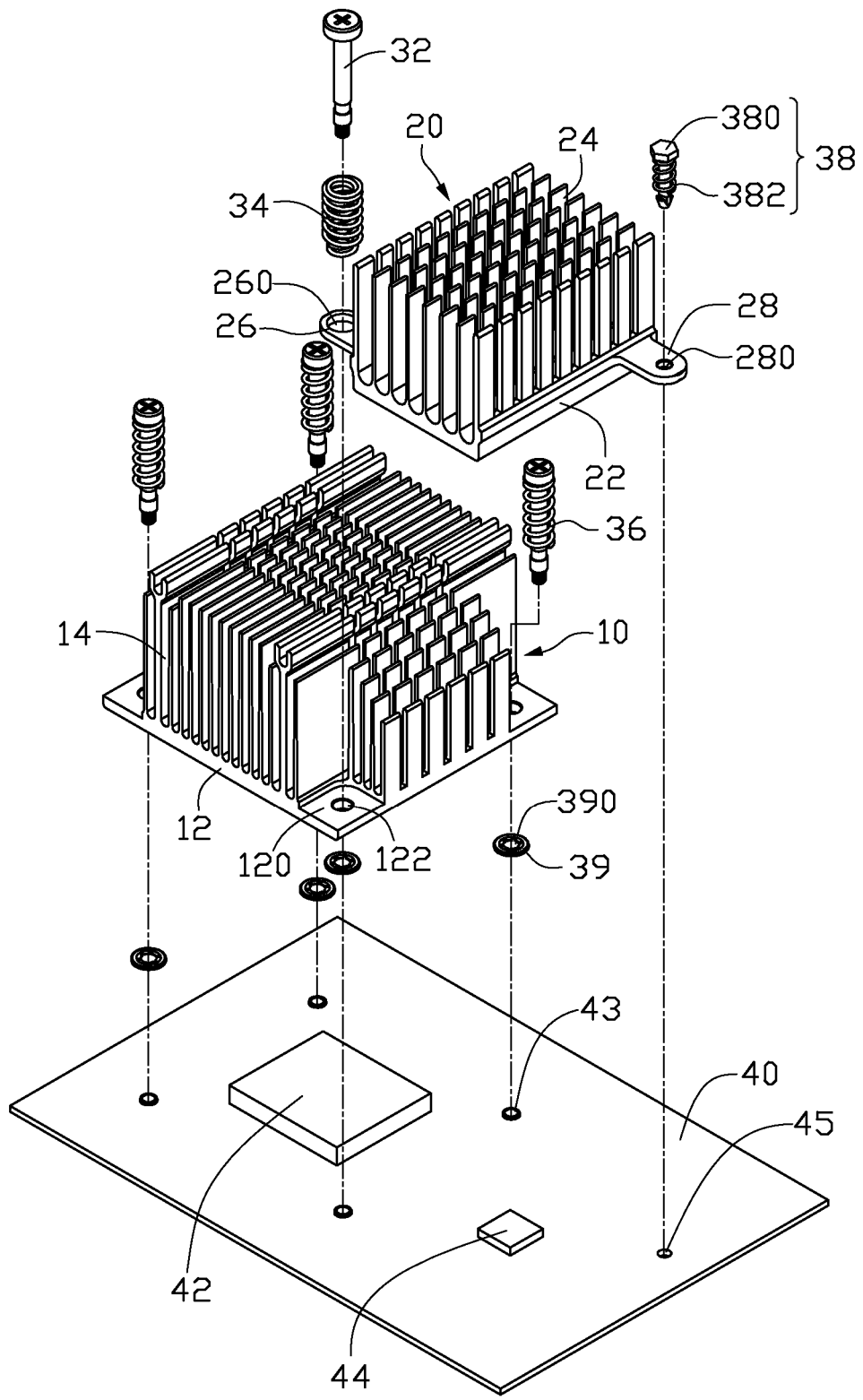
FIG. 2 is an exploded, isometric view of FIG. 1.

Referring to FIGS. 1 and 2, a heat sink assembly in accordance with a preferred embodiment of the invention is adapted for dissipating heat from two heat-generating components 42, 44 mounted on a printed circuit board 40. The heat sink assembly comprises a first heat sink 10, a second heat sink 20 coupled to the first heat sink 10, a fastening assembly attaching the first and second heat sinks 10, 20 onto the heat-generating components 42, 44.

In this embodiment, the heat-generating component 42 is bigger than the heat-generating component 44 either in power or size. Top surfaces of the heat-generating components 42, 44 can be in different level. Four fixing holes 46 are defined in the printed circuit board 40 and evenly surrounding the heat-generating component 42. A locking orifice 45 is defined in the printed circuit 40 and located to a lateral side of the heat-generating component 44 which is remote from the heat-generating component 44.

The first heat sink 10 is integrally made of a thermally conductive metal such as aluminum, and comprises a rectangular base 12 whose bottom surface intimately contacts with the heat-generating component 42 and a plurality of parallel first fins 14 extending perpendicularly from a top surface of the base 12. The base 12 has four rectangular fixing parts 120 at four corners thereof. Each of the fixing part 120 has not first fin 14 arranged thereon and therein defines a receiving hole 122 corresponding to the fixing hole 43 of the printed circuit board 40.

The second heat sink 20 is integrally made of a thermally conductive metal such as aluminum, and comprises a rectangular base plate 22 whose bottom surface intimately contacts with the heat-generating component 44, a plurality of parallel second fins 24 extending perpendicularly from a top surface of the base plate 22, a first shoulder 26 and a second shoulder 28 respectively extending outwardly from two lateral sides thereof. The first shoulder 26 and the second shoulder 28 are adjacent to two diagonal corners of the base plate 22 and extend laterally from lower portions of two outermost ones of the second fins 24. Bottom surfaces of the first and second shoulders 26, 28 are in a level higher than the top surface of the base plate 22. The first shoulder 26 of the second heat sink 20 therein defines a through hole 260 which is located adjacent to a distal end of the first shoulder 26 and has a caliber bigger than that of the receiving hole 122 of the first heat sink 10. The first shoulder 26 of the second heat sink 20 is configured to sit on one of the fixing parts 120 of the first heat sink 10 so that the first and second heat sinks 10, 20 are juxtaposedly mounted on the printed circuit board 40. The second shoulder 28 therein defines a through orifice 280 which is located adjacent to distal end of the second shoulder 28 and corresponding to the locking orifice 45 of the printed circuit board 40. The through orifice 280 of the second shoulder 28 has an inner diameter smaller than that of the through hole 260 of the first shoulder 26.

Figure 3:
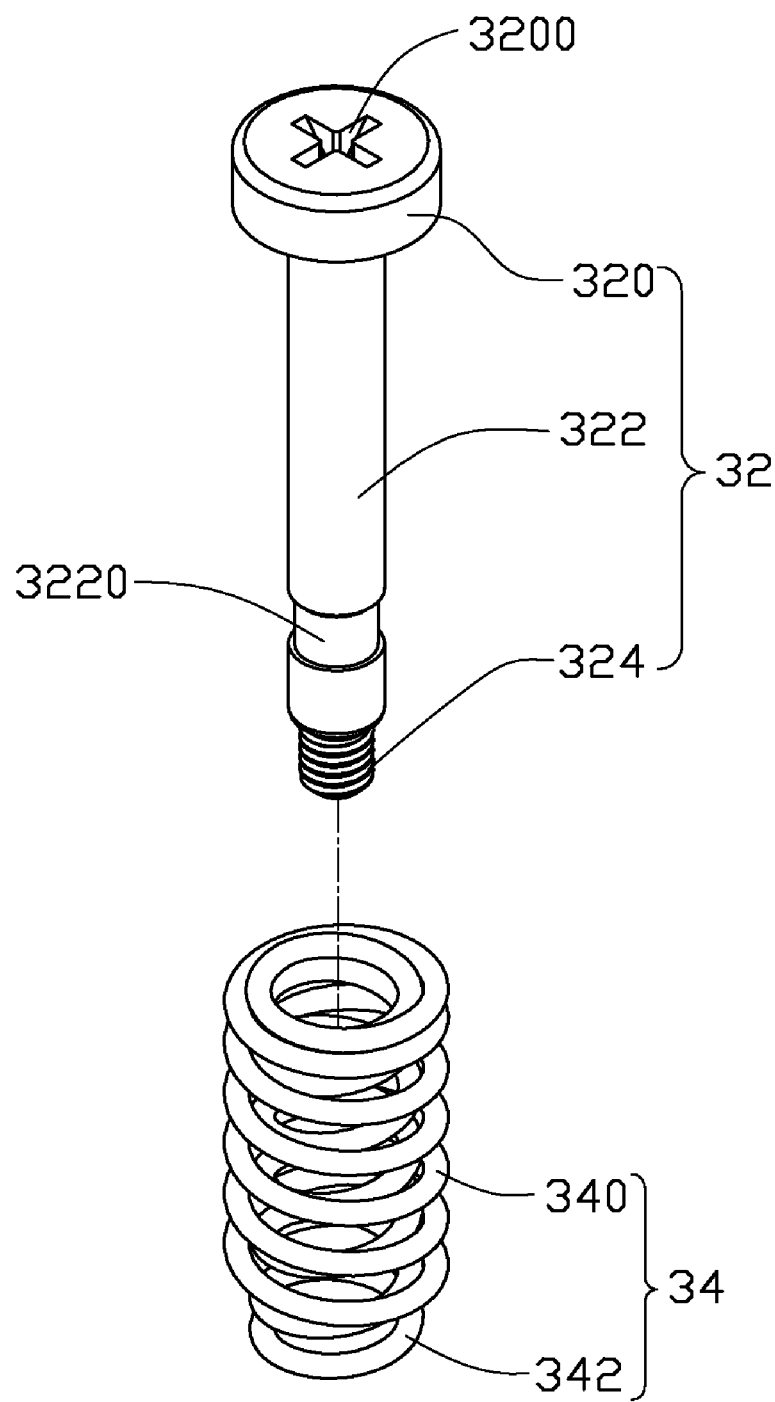
FIG. 3 is an enlarged, exploded view of members of a fastening assembly in FIG. 2.
Figure 4:
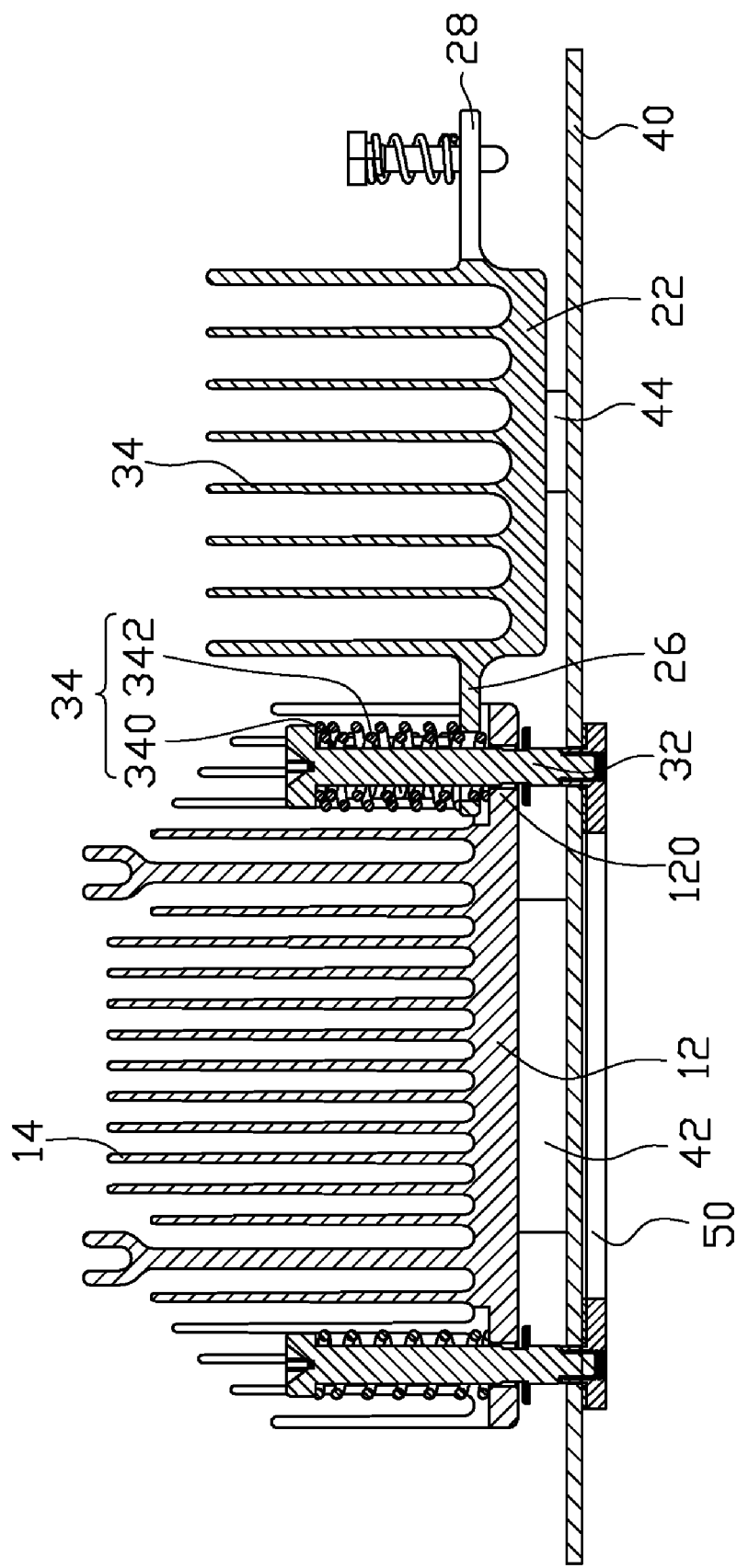
FIG. 4 is a cross section view along line IV-IV in FIG. 1.

As shown in FIG. 2 and FIG. 3, the fastening assembly comprises four poles 32, a double-layer spring 34 wearing on one of the poles 32 which is used to extend through the first shoulder 26 of the second heat sink 20, three springs 36 respectively encircling other three of the poles 32, a fixture 38 received in the through orifice 280 of the second shoulder 28 of the second heat sink 20 and four retaining rings 39 mounted around the poles 32. Each of the poles 32 has a circular head 320 at a top thereof, a shaft 322 extending downwardly from a bottom of the head 320 and an engaging portion 324 connected to the shaft 322 at a bottom end thereof. The shaft 322 in circumference thereof defines an annular recession 3220 adjacent to the engaging portion 324 for receiving the retaining ring 39. The head 320 at a top thereof defines a cross-shaped slot 3200 therein for positioning a tool (not shown), such as a screwdriver. The head 320 has an outer diameter bigger than that of the shaft 322. Outer screw threads are formed in circumference of the engaging portion 324 for extending through the corresponding fixing hole 43 in the printed circuit board 40 and being threadedly engaged in the back plate 50 (shown in FIG. 4). The double-layer spring 34 is integrally formed by metallic tensile wire and consists an outer spring 340 and an inner spring 342 interconnecting with the outer spring 340 at a top thereof. The outer spring 340 has an inner diameter bigger than the caliber of the through hole 260 of the first shoulder 26 of the first heat sink 10, and is configured to being compressed between the head 320 of the pole 32 and the first shoulder 32 when the pole 32 is received in the through hole 260. The inner spring 340 is longer than the outer spring 340, has a top end which is interconnected to a top end of the outer spring 340 and a bottom end projecting downwardly from a bottom end of the outer spring 340. The inner spring 342 has a size and length that are approximately equal to that of the spring 36 and is configured to pass through the through hole 260 of the first shoulder 26 of the first heat sink 10 and abut against a corresponding fixing part 120 of the heat sink 10. The fixture 38 extending through the through orifice 280 of the second shoulder 28 of second heat sink 20 includes a peg 380 and a spring component 382 encircling the peg 380. The peg 380 has a head (not labeled) at top end thereof and a barb (not labeled) at bottom end thereof. Each of the retaining rings 39 has an engaging hole 390 at a center therein for engaging into the annular recession 3220 of the pole 32 after the annular recession 3220 passes through the receiving hole 122 of the first heat sink 10 to pre-assemble the pole 32 wearing the spring 36 or the double-layer spring 34 to the heat sink assembly.

In assembly of the heat sink assembly to the heat-generating components 42, 44 on the printed circuit board 40, the first and second heat sinks 10, 20 are respectively placed on the two heat-generating components 42, 44. The first shoulder 26 of the second heat sink 20 is placed on corresponding front one of the fixing parts 120 of the first heat sink 10. One of the poles 32 wearing the double-layer spring 34 is received in the through hole 260 of the first shoulder 26 and the corresponding receiving hole 122 of the fixing part 120 under the first shoulder 26, and is locked by the retaining ring 39. Other three poles 32 wearing the spring 36 are respectively received in the receiving holes 122 of the other three fixing parts 120 of the first heat sink 10, and also secured by retaining springs 39. The fixture 38 extends through the through orifice 280 of the second shoulder 28 of the second heat sink 20 and has its barb locked beneath the printed circuit board 40 after the barb is pressed downwardly to deform to pass through the locking orifice 45 of the printed circuit board 40. The engaging parts 324 of the four poles 32 are respectively driven downwardly to extend through the fixing holes 43 of the printed circuit board 40 to screw into the back plate 50 secured beneath the printed circuit board 40. The heat sink assembly is thus secured mounted to the printed circuit board 40 in a predetermined position.

In use of the heat sink assembly, the outer spring 340 is compressed between the head 320 of the pole 32 and the first shoulder 26 of the second heat sink 20; the inner spring 342 is compressed between the head 320 of the pole 32 and the corresponding fixing part 120 of the first heat sink 10 under the first shoulder 26. The outer and the inner springs 340, 342 of the double-layer springs 34 encircling the same one of the poles 32 will not interfere with each other and work independently. The first shoulder 26 or the second shoulders 28 is depressed toward the heat-generating components 42, 44 respectively by the outer spring 340 and the spring component 382 of the fixture 38, thus if the heat sink assembly is used properly, weight of one of the second heat sink 20 will not fall on the first heat sink 10. In other world, the heat sink assembly can main sure that each heat sink 10, 20 intimately contacts with the corresponding array of heat-generating components 42/44 and also avoids each of the heat-generating components 42/44 suffering an excess burden from other heat sink 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention

What is claimed is:

1. A heat sink assembly for removing heat from two heat generating-components mounted on a printed circuit board, comprising:
   a first heat sink comprising a base contacting with one of the heat generating-components and a plurality of fins arranged on the base;
   a second heat sink contacting with the other heat generating-component, the second heat sink having a first shoulder extending toward the first heat sink from a lateral side thereof and superposed onto the base of the first heat sink;
   a plurality of poles mounting the first and second heat sinks onto the heat generating-components and each having a head at a top end thereof; and
   a double-layer spring comprising an outer spring and an inner spring interconnected each other at a top thereof;
   wherein one of the poles wearing the double-layer spring extends through the first shoulder of the second heat sink and the base of the first heat sink, the outer spring is compressed between the head of the pole and the first shoulder, the inner spring is compressed between the head of the pole and the base of the first heat sink under the first shoulder.

2. The heat sink assembly as claimed in claim 1, wherein the double-layer spring is formed integrally, a bottom end of the inner spring projects downwardly from a bottom end of the outer spring.

3. The heat sink assembly as claimed in claim 1, wherein the base of the first heat sink defines four fixing parts in four corners thereof, each of the fixing parts therein defines a fixing hole receiving the pole.

4. The heat sink assembly as claimed in claim 3, wherein the inner spring extends through the first shoulder and is compressed between the head and a corresponding fixing part.

5. The heat sink assembly as claimed in claim 3, wherein the second heat sink comprises a base plate, a plurality of second fins extending upwardly from the base plate and a second shoulder extending outwardly from another lateral side of the second heat sink.

6. The heat sink assembly as claimed in claim 5, wherein the first shoulder and the second shoulder are located adjacent to two diagonal corners of the second heat sink.

7. The heat sink assembly as claimed in claim 5, wherein a bottom surface of the first shoulder is in a level higher top surface of the base plate.

8. The heat sink assembly as claimed in claim 5, wherein the second shoulder therein defines a through orifice receiving a fixture, the fixture has a barb at a bottom end thereof and locked beneath the printed circuit board.

9. The heat sink assembly as claimed in claim 3, further comprising three springs each having a size and length equal to the inner spring, three poles wearing the springs are received in the fixing holes of the other three fixing parts.

10. The heat sink assembly as claimed in claim 9, wherein the springs are compressed between the heads of the poles and fixing parts.

11. The heat sink assembly as claimed in claim 3, wherein each of the poles has an engaging part at lower end thereof and an annular recession in circumference there above the engaging part.

12. The heat sink assembly as claimed in claim 11, further comprising a plurality of retaining rings that are respectively engaged into the annular recessions of the poles and held beneath the printed circuit board.

13. A heat sink assembly for removing heat from two heat generating-components mounted on a printed circuit board, comprising:

a first heat sink comprising a base contacting with one of the heat generating-components and a plurality of fins arranged on the base;

a second heat sink contacting with the other heat generating-component and having a first shoulder and a second shoulder extending laterally two diagonal corners thereof;

a plurality of poles securing the heat sinks onto the heat generating-components and each having a head at a top end thereof; and a double-layer spring comprising an outer spring and an inner spring having a top end connected to a top end of the outer spring and a bottom end projecting downwardly from a bottom end of the outer spring;

wherein the first shoulder is disposed on the base of the first heat sink, one of the poles wearing the double-layer spring extends through the first shoulder and the base, the outer spring is compressed between the head of the pole and the first shoulder, the inner spring extends through the first shoulder and is sandwiched between the head of the pole and the base of the first heat sink under the first shoulder.

14. The heat sink assembly as claimed in claim 13, wherein the base defines four fixing parts in four corners thereof, each of the fixing parts therein defines a fixing hole receiving the pole, the inner spring is compressed between the head and the corresponding fixing part.

15. A heat sink assembly, comprising:

a first heat sink having a base and a plurality of fins extending from the base;

a second heat sink having a base plate and a plurality of fins extending from the base plate, a superposition formed between the base plate of the second heat sink and the base of the first heat sink;

a pole extending through the superposition of the first and second heat sinks; and a double layer spring loosely mounted around the pole comprising an outer spring compressed between the base plate of the second heat sink and a top of the pole, and an inner spring interconnecting the outer spring at a top of the outer spring and compressed between the base of the first heat sink and the top of the pole.

16. The heat sink assembly as claimed in claim 15, wherein the base of the first heat sink has four corners without fins thereon, and the base plate of the second heat sink forms first and second ears from two diagonal corners thereof, the first ear of the second heat sink is disposed on one of the corners of the base of the first heat sink to form the superposition.

17. The heat sink assembly as claimed in claim 16, wherein three poles wearing three single layer spring extend through other three corners of the first heat sink.

* * * * *